United States Patent
Toyoda et al.

(10) Patent No.: US 6,936,904 B2
(45) Date of Patent: Aug. 30, 2005

(54) PHOTO SENSING INTEGRATED CIRCUIT DEVICE AND RELATED CIRCUIT ADJUSTMENT

(75) Inventors: Inao Toyoda, Okazaki (JP); Masaki Takashima, Kariya (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 151 days.

(21) Appl. No.: 10/613,192

(22) Filed: Jul. 3, 2003

(65) Prior Publication Data

US 2004/0061193 A1 Apr. 1, 2004

Related U.S. Application Data

(62) Division of application No. 09/057,561, filed on Apr. 9, 1998, now abandoned.

(30) Foreign Application Priority Data

Apr. 10, 1997 (JP) ............................................... 9-92481
Apr. 10, 1997 (JP) ............................................... 9-92482
Apr. 14, 1997 (JP) ............................................... 9-96050

(51) Int. Cl.[7] ............................................. H01L 21/20
(52) U.S. Cl. ........................ 257/431; 257/435; 257/380; 438/14; 438/382; 438/57
(58) Field of Search ............................... 257/431–436, 257/379–381; 438/14, 382, 56–57, 7

(56) References Cited

U.S. PATENT DOCUMENTS

| | | | |
|---|---|---|---|
| 3,952,323 A | 4/1976 | Tanimura et al. ............. | 357/15 |
| 4,606,781 A | * 8/1986 | Vyne ............................ | 438/10 |
| 4,841,138 A | 6/1989 | Muro .......................... | 250/209 |
| 5,101,253 A | 3/1992 | Mizutani et al. ............. | 357/30 |
| 5,105,090 A | 4/1992 | Miyajima et al. ............ | 257/551 |
| 5,117,118 A | 5/1992 | Fukuyama ................... | 250/551 |
| 5,223,728 A | 6/1993 | Gempe ........................ | 257/290 |
| 5,239,193 A | 8/1993 | Benton et al. ............... | 257/292 |
| 5,266,529 A | 11/1993 | Lau et al. | |
| 5,293,051 A | 3/1994 | Mariyama et al. ........... | 257/129 |
| 5,426,526 A | 6/1995 | Yamamoto et al. ........... | 359/82 |
| 5,598,022 A | 1/1997 | Kyomasu ..................... | 257/458 |
| 5,602,384 A | 2/1997 | Nunogaki et al. | |
| 5,736,756 A | 4/1998 | Wakayama et al. .......... | 257/223 |
| 5,811,867 A | 9/1998 | Yamamoto et al. .......... | 257/458 |

FOREIGN PATENT DOCUMENTS

| | | |
|---|---|---|
| JP | 60-45061 | 3/1985 |
| JP | 60-133747 | 7/1985 |
| JP | 61-070874 | 4/1986 |
| JP | 61-111161 | 7/1986 |
| JP | 61-154373 | 7/1986 |
| JP | 62-2653 | 1/1987 |
| JP | 62-69672 | 3/1987 |

(Continued)

OTHER PUBLICATIONS

"Digital Circuit" by Hiroshi Inose et al.; published Apr. 28, 1980 (W/English Abstract), publisher unknown.
Office Action dated Sep. 21, 2004 in corresponding Japanese Application No. H09–096050 with English translation.
Office Action dated Jul. 16, 2004 in corresponding Japanese Application No. H09–092481 with English translation.

*Primary Examiner*—H. Jey Tsa
(74) *Attorney, Agent, or Firm*—Harness, Dickey & Pierce, PLC

(57) ABSTRACT

A light-receiving element having a light-receiving portion is formed on a chip surface. A digital circuit element, an analog circuit element and a circuit adjusting element are provided for cooperatively processing a detection signal produced from the light-receiving element. And, a light-shielding film is provided for selectively setting a light-receiving region on the chip surface.

12 Claims, 12 Drawing Sheets

FOREIGN PATENT DOCUMENTS

| | | |
|---|---|---|
| JP | 62-202556 | 9/1987 |
| JP | 62-226659 | 10/1987 |
| JP | 63-116458 | 5/1988 |
| JP | 63-208269 | 8/1988 |
| JP | 63-274174 | 11/1988 |
| JP | 64-54758 | 3/1989 |
| JP | 64-054758 | 3/1989 |
| JP | 2-251174 | 10/1990 |
| JP | 3-60073 | 3/1991 |
| JP | 4-75371 | 3/1992 |
| JP | 5-291507 | 11/1993 |
| JP | 6-104476 | 4/1994 |
| JP | 6-326282 | 11/1994 |
| JP | 7-211510 | 8/1995 |
| JP | 8-148569 | 6/1996 |
| JP | 8-213581 | 8/1996 |

* cited by examiner

- - - - WITHOUT LIGHT IRRADIATIOIN
———— WITH LIGHT IRRADIATION
(200001X)

SENSOR FORMING SEGMENTS

PHOTO SENSING INTEGRATED CIRCUIT DEVICE AND RELATED CIRCUIT ADJUSTMENT

BACKGROUND OF THE INVENTION

The present invention relates to a photo sensing integrated circuit device comprising a light receiving element for receiving incoming light, and a signal processing circuit (including transistors) for processing a detected light signal.

Furthermore, the present invention relates to a circuit adjustment for the photo sensing integrated circuit device.

In a detection of incoming light, a light signal is detected as a weak signal when the light is detected by a light receiving element, such as a photo diode. In general, such a weak signal needs to be processed by an appropriate signal processing device including as an amplifier and/or a digital converter. However, a circuit arrangement with additional and separate circuit elements is weak when subjected to extraneous noises and therefore tends to cause an erroneous detection.

To solve this problem, it may be possible to integrate the light receiving element and the signal processing circuit. When these members are integrated, it is necessary to guide the incoming light exclusively to the light receiving element. If the light enters into the signal processing circuit, unnecessary photoelectric current may be produced. This will result in an erroneous detection.

SUMMARY OF THE INVENTION

An object of the present invention is to provide a photo sensing integrated circuit device having a smaller chip size.

Another object of the present invention is to provide a photo sensing integrated circuit device capable of surely eliminating any erroneous detection derived from extraneous light.

Another object of the present invention is to provide an adjusting method and a corresponding apparatus applicable to the photo sensing integrated circuit device.

In order to accomplish this and other related objects, a first aspect of the present invention provides a photo sensing integrated circuit device comprising a light-receiving element having a light-receiving portion formed on a chip surface thereof. A digital circuit element, an analog circuit element and a circuit adjusting element are provided for cooperatively processing a detection signal produced from the light-receiving element. And, a light-shielding film is provided for selectively setting a light-receiving region on the chip surface.

Preferably, the digital circuit element is an integrated injection logic element. The analog circuit element is a bipolar transistor. The circuit adjusting element is a thin-film resistor formed on the chip surface. The light-shielding film is an aluminum-group metallic film disposed on the chip surface. The light-receiving film may be provided on an insulating film formed on the chip surface for flattening processing. The insulating film may be formed by laminating a first tetra-ethyl-ortho-silicate film, a spin-on-glass layer, and a second tetra-ethyl-ortho-silicate film successively. The light-shielding film may be electrically connected to a terminal having a predetermined electric potential. More specifically, the light-shielding film may be connected to a terminal giving an electric potential of a chip substrate.

Furthermore, it is preferable that the chip substrate is a silicon substrate having a surface azimuth defied by (100).

Preferably, the light-shielding film covers a surface of an element having electric characteristics varying in response to light irradiation and uncovers the light-receiving element and the circuit adjusting element. In this case, the element having electric characteristics varying in response to light irradiation is at least one selected from the group consisting of an integrated injection logic circuit element, a bipolar transistor, a diffusion resistor, a diode, and a capacitor utilizing a depletion-layer capacitance in a p-n junction.

A second aspect of the present invention provides a photo sensing integrated circuit device comprising a photoelectric transfer element formed at a predetermined portion of a semiconductor substrate for converting received light into an electric signal. A signal processing circuit is formed at a predetermined portion of the semiconductor substrate for processing the electric signal of the photoelectric transfer element. The photoelectric transfer element and the signal processing circuit are integrated as a single chip. At least one circuit element of the signal processing circuit is covered by a light-shielding film. The semiconductor substrate has at least one element forming region for separately forming the circuit element in this element forming region. And, the circuit element is maintained at a predetermined electrical potential.

Preferably, the circuit element is electrically connected to a power source terminal having an electrical potential capable of maintaining a parasitic transistor of the semiconductor substrate in a turned-off condition. For example, a base potential is maintained at a value equal to or larger than an emitter potential in the parasitic transistor of the semiconductor substrate.

A third aspect of the present invention provides an adjusting method for a single chip photo sensing device comprising a photoelectric transfer element for converting received light into an electric signal, a signal processing circuit for processing the electric signal of the photoelectric transfer element, and a thin-film resistor used for a circuit adjustment. More specifically, in a first step, an ammeter is connected to an output terminal of the photoelectric transfer element. In a second step, reference light having a predetermined intensity is irradiated on the photoelectric transfer element. In a third step, a current value detected by the ammeter is stored when the photoelectric transfer element is irradiated by the reference light. In a fourth step, the ammeter is replaced with a current generating source. In a fifth step, current is supplied from the current generating source to the signal processing circuit by an amount identical with the stored current value under a condition no light is irradiated on the photoelectric transfer element. And, in a sixth step, a laser trimming is performed on the thin-film resistor to generate a desired output from the signal processing circuit as a result of the circuit adjustment.

Preferably, the photoelectric transfer element is a photo diode and the output terminal is an anode. The circuit adjustment is performed on a wafer comprising a plurality of sensor forming segments.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
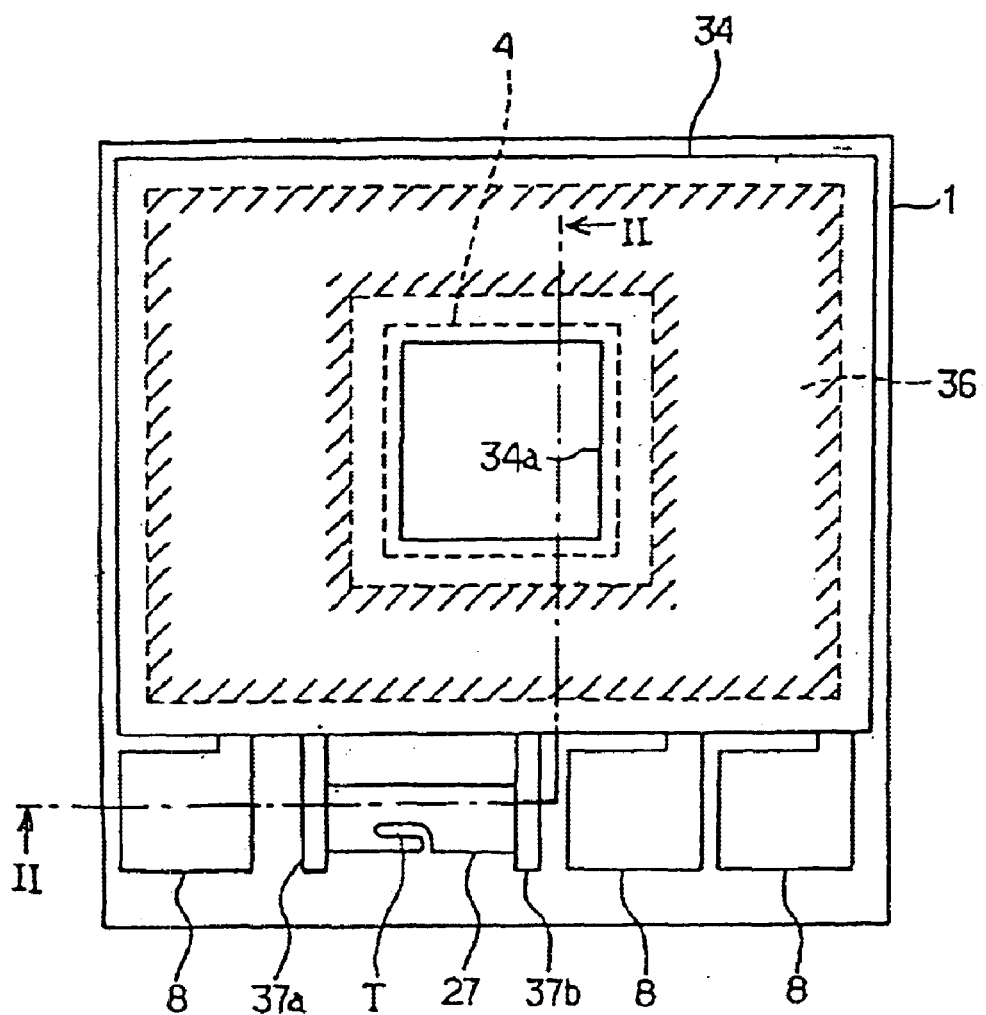
FIG. 1 is a plan view showing a photo sensing integrated circuit device in accordance with a first embodiment of the present invention.

Preferred embodiments of the present invention will be explained hereinafter with reference to accompanied drawings. Identical parts are denoted by the same reference numerals throughout the drawings.

First Embodiment

Figure 2:
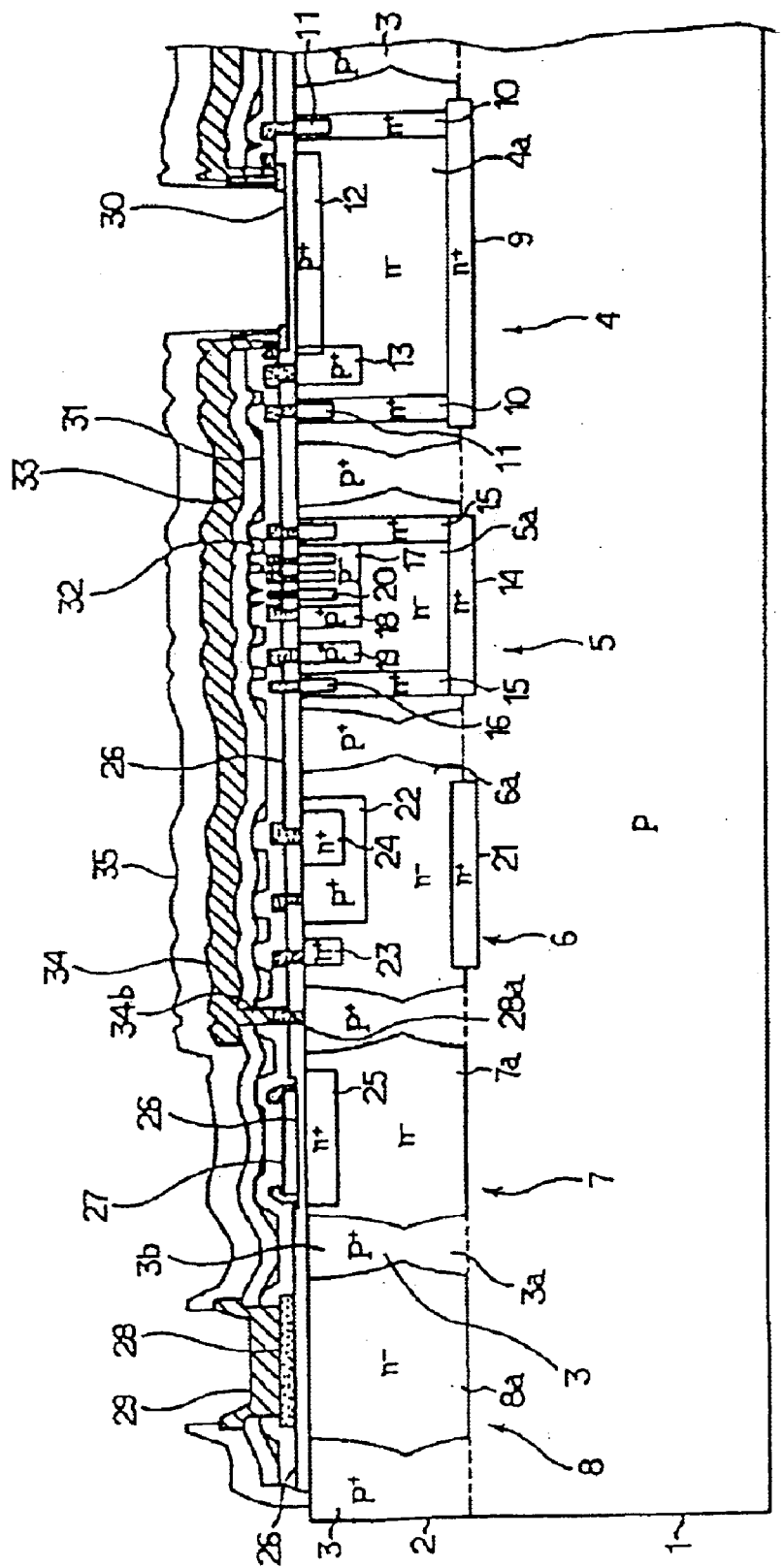
FIG. 2 is a vertical cross-sectional view showing an arrangement of the photo sensing integrated circuit device in accordance with the first embodiment of the present invention, taken along a line II—II of FIG. 1.

As shown in FIG. 2, a photo sensing integrated circuit device of this embodiment has a semiconductor substrate which is a high-density, p-type silicon substrate 1. In the drawing, each high-density region is indicated by $p^+$ or $n^+$. This silicon substrate 1 has a surface azimuth defined by (100). A low-density, n-type epitaxial layer 2 is formed on the silicon substrate 1 as indicated by a dotted line in FIG. 2. In the drawing, each low-density region is indicated by $p^-$ or $n^-$. The epitaxial layer 2 is separated into a plurality of $n^-$ type element forming regions. Each elemental forming region is surrounded by $p^+$ type separate diffusion region 3.

The separate diffusion region 3 comprises a lower $p^+$ type region 3a and an upper $p^+$ type region 3b. In forming this separate diffusion region 3, an impurity layer embedded beforehand is thermally diffused to form the lower $p^+$ type region 3a extending upward. After forming the epitaxial layer 2, the impurity is thermally diffused to form the upper $p^+$ type region 3b extending downward and united with the lower $p^+$ type region 3a.

When the epitaxial layer 2 is formed, some element forming regions may comprise an $n^+$ type impurity region embedded beforehand. This $n^+$ type impurity region serves as a low-resistance region allowing current to flow in a transverse direction after a corresponding element is formed. Details of the elements formed in respective element forming regions will be described later. For example, a photo diode 4 serving as a light-receiving element, an IIL (i.e., integrated injection logic) element 5 functioning as a digital circuit element, a bipolar transistor 6 acting as an analog circuit element, and a thin-film resistor element 7 serving as a circuit adjusting element are formed. Furthermore, other various circuit elements including a diffusion resistor, a capacitor and a diode are formed in addition to an electrode pad 8.

The photo diode 4 is provided in an element forming region 4a that is one of separate regions in the epitaxial layer 2. An $n^+$ type embedded diffusion region 9 is formed beforehand along a boundary surface between the element forming region 4a and the substrate 1. An $n^+$ type region 10 is provided along a periphery of this diffusion region 9 so as to extend across the epitaxial layer 2 to a top surface of the epitaxial layer 2. An $n^+$ type region 11, serving as a contact, is formed at a top surface portion of this $n^+$ type region 10. A $p^+$ type diffusion region 12 is formed at an inner top surface portion of the element forming region 4a. This $p^+$ diffusion region 12 constitutes a p-n junction functioning as a light-receiving portion. A $p^+$ type diffusion region 13, serving as a contact, is formed at one end of the $p^+$ type diffusion region 12.

The IIL element 5 is provided in an element forming region 5a that is one of separate regions in the epitaxial layer 2. An $n^+$ type embedded diffusion region 14 is formed beforehand along a boundary surface between the element forming region 5a and the substrate 1. An $n^+$ type region 15 is provided along a periphery of this diffusion region 14 so as to extend across the epitaxial layer 2 to a top surface of the epitaxial layer 2. An $n^+$ type region 16, serving as a contact, is formed at a top surface portion of this $n^+$ type region 15. A $p^-$ type base layer 17 is formed at an inner top surface portion of the element forming region 5a, together with a $p^+$ type region 18 serving as a contact of this $p^-$ type base layer 17. A $p^+$ type injector layer 19 is also formed at this inner top surface portion of the element forming region 5a. Furthermore, a total of three $n^+$ type emitter layers 20 are formed in the base layer 17.

The bipolar transistor 6 is provided in an element forming region 6a that is one of separate regions in the epitaxial layer 2. An $n^+$ type embedded diffusion region 21 is formed beforehand along a boundary surface between the element forming region 6a and the substrate 1. A $p^+$ type region 22 is formed at a top surface portion of the element forming region 6a. An $n^+$ type collector region 23 is also formed at the top surface portion of the element forming region 6a. An $n^+$ type emitter region 24 is formed in the base region 21.

The thin-film resistor element 7 is provided in an element forming region 7a that is one of separate regions in the epitaxial layer 2. An $n^+$ type region 25 is formed at a top surface portion of the element forming region 7a. An oxide film 26, having a predetermined film thickness, is provided on the top surface of this element forming region 7a. A thin-film resistor 27, made of CrSi (chrome silicon) and configured into a predetermined shape, is provided on this oxide film 26.

The electrode pad 8 is provided in an element forming region 8a that is one of separate regions in the epitaxial layer 2. An oxide film 26 is formed on a top surface of the epitaxial layer 2 in this element forming region 8a. An electrode pattern 28 and another electrode pattern 29 are successively laminated on the oxide film 26. Each of the electrode patterns 28 and 29 is patterned by using an appropriate wiring member such as aluminum. The electrode pad 8 is electrically connected to an external device via an electrical bonding lead.

As described above, the oxide film 26 is formed on the surfaces of circuit elements 4 to 8 incorporated in the substrate 1. A predetermined electrode pattern 28, having a film thickness of approximately 1.1 μm, is formed at a portion corresponding to a terminal, after the above-described aluminum wiring processing. An oxide film 30, different from the above-described oxide film 26, is formed on the surface of the p$^+$ type diffusion layer 12 of the photo diode 4. This oxide film 30 serves as an anti-reflection film that optically prevents incoming light from being reflected. Thus, the incoming light can be effectively introduced into the photo diode 4.

A first TEOS (tetra-ethyl-ortho-silicate) film 31, having a film thickness of approximately 200 nm, is formed on the surface of the substrate 1 thus formed. An SOG (spin-on-glass) layer 32 is provided on the surface of first TEOS film 31. A second TEOS film 33, having a film thickness of approximately 700 nm, is formed on the surface of the SOG layer 32. The first TEOS film 31, the SOG layer 32 and the second TEOS film 33, successively laminated in this manner, cooperatively serve as a united insulating film used for flattening the upper face of the photo sensing integrated circuit. That is, recessed or stepped portions are formed by the above-described patterning processing for the aluminum wiring. However, these recessed or stepped portions can be concealed by the SOG layer 32. Laminating the second TEOS film 33 on the SOG layer 32 surely provides a flat and smooth surface.

A light-shielding film 34, formed by an aluminum-group (e.g., Al—Si) metallic film, is formed at a predetermined light-shielding region on the surface of the flat second TEOS film 33. The light-shielding film 34 has a film thickness of approximately 1.3 μm. In this embodiment, the predetermined light-shielding region corresponds to the surfaces of signal processing circuit elements including the IIL element 5 and the bipolar transistor 6. The electrode pattern 29 for the electrode pad 8 is formed by using Al—Si simultaneously with the formation of the light-shielding film 34. The light-shielding film 34 is electrically connected to the p$^+$ type separate diffusion region 3 at a predetermined portion 34b via an aluminum electrode 28a. Thus, the light-shielding film 34 is identical in electrical potential with the substrate 1.

A protecting film 35, e.g., an SiN film, is formed on the surface of the light-shielding film 34. The protecting film 35 has a film thickness of approximately 1.6 μm. The protecting film 35 is not provided on the electrode pattern 29. Thus, the electrode pattern 29 is in an uncovered condition. None of the light-shielding film 34 and the protecting film 35 are provided on the light-receiving face of the photo diode 4. Thus, the anti-reflection film 30 is directly exposed to the incoming light.

FIG. 1 is a plan view showing a schematic arrangement of the above-described photo sensing integrated circuit. The photo diode 4 is disposed at a center of the substrate 1. The photo diode 4 is surrounded by an element arranging region 36 for accommodating the signal processing circuit elements including the IIL element 5 and the bipolar transistor 6. The upper surface of the element arranging region 36 is covered by the above-described light-shielding film 34. The light-shielding film 34 overhangs the element arranging region 36 so as to extend from an edge of the element arranging region 36 by a predetermined distance. The light-shielding film 34 is provided with an opening 34a for uncovering the light-receiving face of the photo diode 4.

A plurality of electrode pads 8, electrically connected to various circuit elements disposed in the element arranging region 36, are positioned at a region not covered by the light-shielding film 34 on an outer peripheral portion of the substrate 1. In the same manner, the thin-film resistor 27 and the aluminum electrode patterns 37a and 37b electrically connected to this thin-film resistor 27 are disposed outside the light-shielding film 34.

Next, a manufacturing method of the above-described photo sensing integrated circuit will be explained. First, n-type embedded layers 9, 14 and 21 are formed on the p type silicon substrate 1 having a surface azimuth (100). Then, diffusion embedding is performed as a preparation for forming the p$^+$ type separate diffusion region 3. Subsequently, the n$^-$ type epitaxial layer 2 is formed on the substrate 1. Then, the p$^+$ type separate diffusion region 3 is formed by performing the separate diffusing for forming the element forming regions 4a, 5a, 6a, 7a and 8a. The impurity is doped into each element forming region by selectively performing the diffusion.

In this case, the photo diode 4 and the IIL 5 have manufacturing processes commonly performed. For example, the n$^+$ type diffusion regions 10 and 11 of the photo diode 4 can be simultaneously formed with the n$^+$ type diffusion regions 15 and 16 of the IIL 5. Regarding other diffusion regions, the ordinary IC manufacturing process can be used for doping the impurities. After forming the diffusion regions of the above-described elements, the p$^+$ type diffusion region 12 of the photo diode 4 is formed by using an ion-implantation method. The p$^+$ type impurities having a predetermined density are doped at a predetermined depth to form a p-n junction.

Next, to form the thin-film resistor 27, a CrSi layer is coated on the oxide film 26 formed on the surface of the substrate 1 by sputtering etc. The coated CrSi layer is configured into a predetermined shape by using photolithographic patterning. Subsequently, a required number of openings are formed at predetermined portions on the oxide film 26 by using the photolithographic patterning. Then, an aluminum (or Al—Si) layer of approximately 1.1 μm is coated by sputtering etc. The coated aluminum layer is shaped into the predetermined electrode pattern 28 by using a photolithographic patterning.

In this case, no etching is applied to the aluminum left on the light-receiving face of the photo diode 4. The remaining aluminum acts as a protector for the anti-reflection film 30. Therefore, the anti-reflection film 30 is not damaged during succeeding manufacturing processes. At the final manufacturing step, this aluminum layer is removed off the light-receiving face of the photo diode 4.

Next, as an insulating film used for the flattening processing, the first TEOS film 31 having a film thickness of approximately 200 nm is formed by using a CVD method. The SOG layer 32, e.g., BPSG (Boron-Phosphor-Silicate Glass), is applied on the first TEOS film 31 to smoothen the recessed or stepped portions. Then, the second TEOS film 33 having a film thickness of approximately 700 nm is formed on the SOG layer 32 by using a CVD method. With the formation of these laminated insulating layers, the recessed or stepped portions formed during the aluminum wiring pattern can be flattened so as to leave a smooth surface.

Thereafter, an opening corresponding to the light-receiving face of the photo diode 4 is provided on each of the first TEOS film 31 and the second TEOS film 33. The aluminum coating applied to the light-receiving face of the photo diode 4 is exposed through this opening. Then, the light-shielding film 34 of Al—Si having a film thickness of approximately 1.3 µm is coated on the second TEOS film 33 by sputtering. Then, a photolithographic patterning is applied on the light-shielding film 34 so as to form the opening 34a corresponding to the light-receiving face of the photo diode 4 and expose the electrode pad 8 and the thin-film resistor 27 (refer to FIG. 1). Thus, the patterned light-shielding film 34 covers or conceals the element arranging region 36.

Next, the protecting film 35 of SiN having a film thickness of approximately 1.6 µm is formed on the light-shielding film 34 by using a CVD method. Then, a photolithographic patterning is applied on the protecting film 35. More specifically, the SiN film 35 is removed off the light-receiving face of the photo diode 4 and from the electrode pad 8 by applying dry etching. Finally, the aluminum coating left on the light-receiving face of the photo diode 4 is removed off by etching.

The manufactured photo sensing integrated circuit device (hereinafter, referred to a chip) is then subjected to an electric output performance check and adjustment. More specifically, a laser beam is irradiated on a planar pattern (refer to FIG. 1) of the thin-film resistor 27 to perform predetermined trimming processing. The thin-film resistor 27 is trimmed by partly burning and cutting the thin-film resistor 27. Preferably, a YAG laser may be used for forming a cutout T on the thin-film resistor 27, as a rough adjustment as shown in FIG. 1. The cutout T extends from an edge of the thin-film resistor 27 inward in a lateral direction. And, after advancing a predetermined distance, the cutout T turns perpendicularly to a longitudinal direction of the thin-film resistor 27. During the cutting operation, the electric performance of the chip is monitored. The size of the cutout T is adjusted in accordance with the monitored value so as to obtain desirable characteristics.

Figure 3:
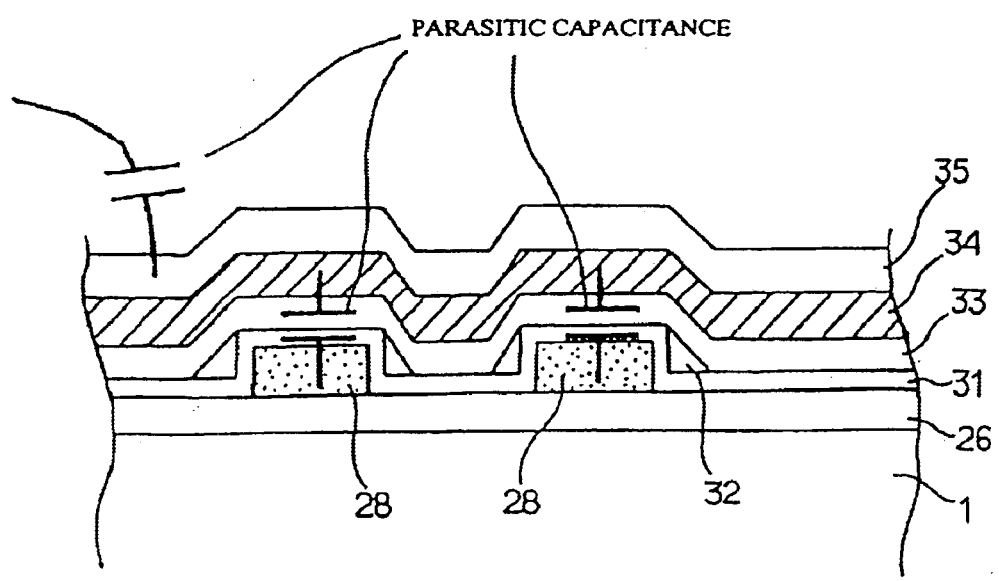
FIG. 3 is a view illustrating a parasitic capacitance.

In the above-described chip, the light-shielding film 34 is formed by an aluminum-group metallic film. Thus, a capacitance coupling is formed between the light-shielding film 34 and the aluminum wiring pattern 28 as shown in FIG. 3. This possibly causes an error in operation due to a parasitic capacitance.

According to this embodiment, the light-shielding film 34 is electrically connected to the substrate 1 at the predetermined portion 34b via the aluminum electrode pattern 28a. With this arrangement, the light-shield film 34 is equalized in electrical potential with the substrate 1. This is effective to eliminate any adverse influence given from an electric power source voltage or from extraneous noises etc. Furthermore, setting the electrical potential of the light-shielding film 34 and the substrate 1 to a ground potential is effective in that the light-shielding film 34 can function as an electric shielding film. This provides a stabilized detecting operation.

The silicon substrate 1, used in this embodiment, has a surface azimuth defined by (100) because the performance of the photo diode 4 can be improved. When compared with a silicon substrate having a surface azimuth (111), the silicon substrate 1 having the surface azimuth (100) is advantageous in that a dark current level is reduced because of its smaller surface level density.

Figure 4:
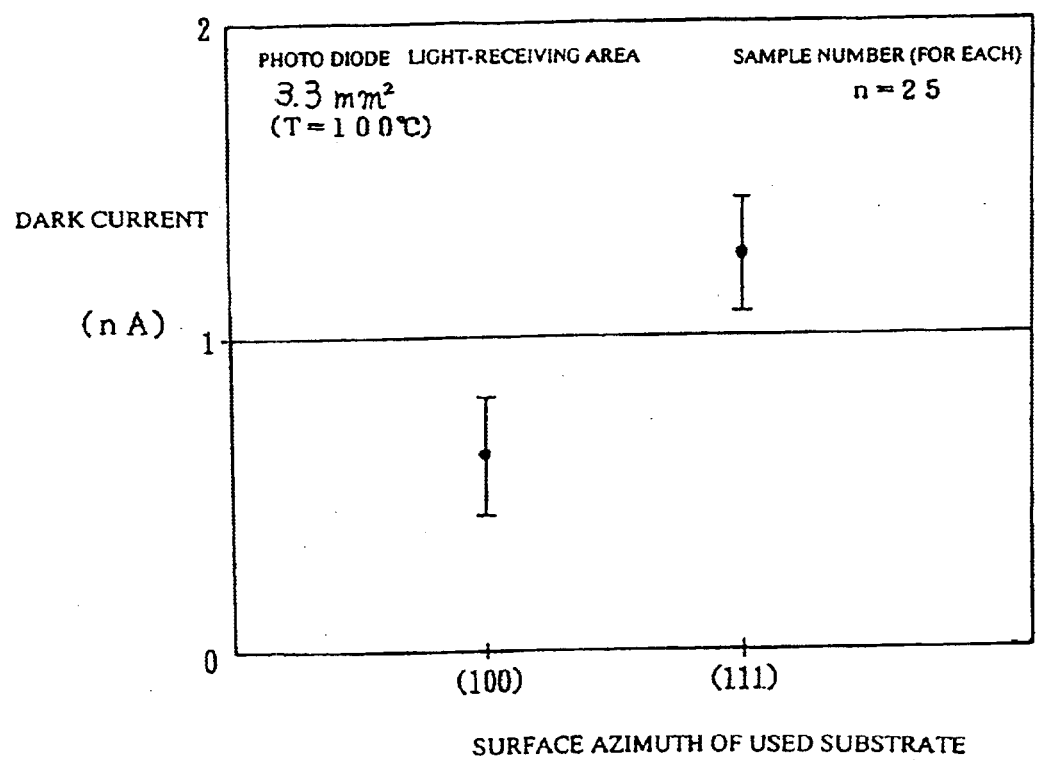
FIG. 4 is a graph showing a dark current level of a photo diode in relation to a surface azimuth of a used substrate.

When an operating temperature is increased, the characteristics brought by the difference in the surface azimuth becomes apparent. FIG. 4 shows the result of a test conducted by the inventors on a total of 25 samples for each silicon substrate under an ambient temperature of 100° C. An average value of the measured dark currents was approximately 0.62 nA (3σ=0.19 nA) when the samples have a surface azimuth (100). On the other hand, an average value of the measured dark currents was approximately 1.25 nA (3σ=0.18 nA) when the samples have a surface azimuth (111). In short, the dark current can be reduced to a half level by using the substrate 1 having a surface azimuth (100) of this embodiment, compared with a substrate having a surface azimuth (100). In this test, a light-receiving area of the photo diode in each tested sample was 3.3 mm².

According to the above-described embodiment, the following effects can be obtained.

First, in a light-receiving operation by the photo diode 4, it is surely prevented that the incoming light enters into the element arranging region 36 by the selectively provided light-shielding film 34. Thus, during the light-receiving operation by the photo diode 4, the signal processing is performed appropriately without causing errors in the IIL element 5, the bipolar transistor 6 and any other circuit elements, such as a diffusion resistor, a diode and a capacitor utilizing a depletion-layer capacitance in the p-n junction. Furthermore, as the above-described arrangement incorporates the IIL element 5 serving as a digital circuit element integrally, it becomes possible to generate an accurate output signal as a digital signal which is generally robust against extraneous noises.

Second, as the circuit incorporates the IIL element 5 serving as a digital circuit element, some of the manufacturing processes for the IIL element 4 and the photo diode 4 can be commonly performed. This is advantageous in that the number of specially performed processes can be substantially reduced.

Third, as the thin-film resistor 27 is provided as a circuit element used for adjusting the circuit performance, the output characteristics of each fabricated chip can be adjusted easily by performing the laser trimming processing.

Fourth, as the light-shielding film 34 is formed by an aluminum-group metallic film, it is not necessary to use a special member. A conventional wiring member, used in an ordinary IC manufacturing, can be used directly for forming the light-shielding film 34.

Fifth, the first TEOS film 31, the SOG layer 32 and the second TEOS film 33 are laminated as a united insulating film between the light-receiving film 34 and the substrate 1. This makes it possible to remove many of unstable factors, such as variation in the film thickness and discontinuation of the surface level, when the light-shielding film 34 is formed. Thus, the light-shielding ability can be assured in the element arranging region 36.

Sixth, as the light-shielding film 34 is electrically connected to the substrate 1, no malfunctions will be caused due to the parasitic capacitance formed between the light-shielding film 34 and the aluminum wiring pattern 28.

Seventh, as the substrate 1 has a surface azimuth defined by (100), the dark current can be reduced significantly compared with a substrate having a surface azimuth (111). Even when the operating temperature is high, the detecting operation can be surely performed.

The present invention is not limited to the above-described embodiment and can be modified in the following manner.

Although the disclosed aluminum wiring pattern 28 is a single layer, it will be preferable to use a multilayered aluminum wiring pattern.

The light-shield film 34 of Al—Si can be replaced by other appropriate aluminum-group metallic film, such as Al—Cu or pure aluminum. Similarly, the aluminum wiring pattern 28 can be formed by using Al—Si or Al—Cu.

The IIL element 5, used as a digital circuit element, can be replaced by other appropriate digital circuit element, such as TTL, CMOS, NMOS or PMOS.

The bipolar transistor 6, used as an analog circuit element, can be replaced by other appropriate analog circuit element, such as a diode, a resistance, a capacitor or a MOS transistor.

The TEOS film, used as an insulating film for the flattening processing, can be replaced by any other insulating film. Furthermore, the SOG 32 can be formed by an appropriate member other than BPSG.

The photo diode 4, disclosed in the above-described embodiment, is positioned at the center of the chip, it is possible to change the position of the photo diode 4. Needless to say, the opening 34a of the light-shielding film 34 is formed at a portion corresponding to the photo diode 4.

Second Embodiment

Hereinafter, a second embodiment of the present invention will be explained. The second embodiment discloses a modified circuit arrangement of the above-described photo sensing integrated circuit device. The following description chiefly explains an essential portion of a modified circuit arrangement. The rest of the arrangement of the second embodiment is basically identical with those disclosed in the first embodiment.

Figure 5:
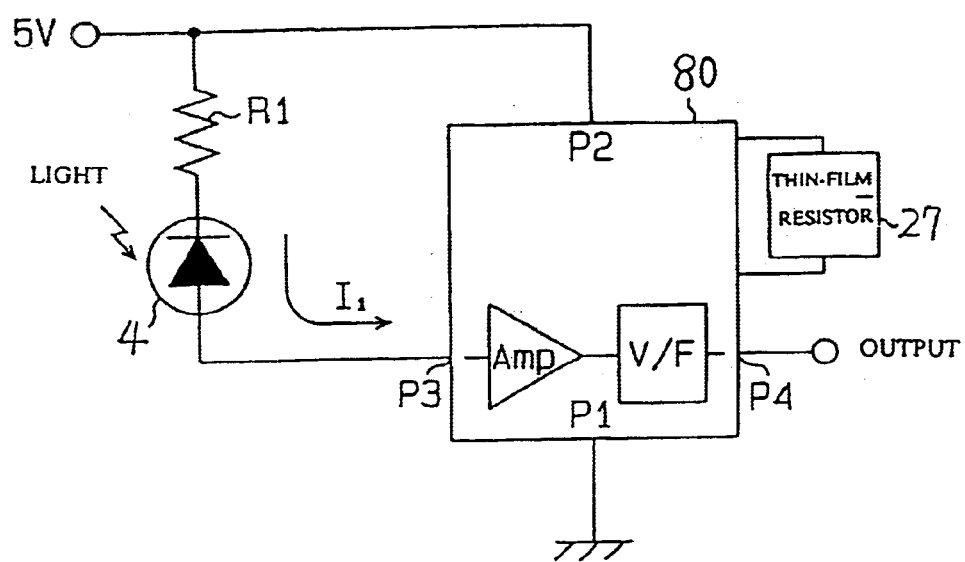
FIG. 5 is a schematic circuit diagram showing a photo sensing integrated circuit device in accordance with a second embodiment of the present invention.

FIG. 5 shows a schematic circuit arrangement of a signal processing circuit 80 which corresponds to the element arranging region 36 shown in the first embodiment comprising various signal processing circuit elements including the IIL element 5 serving as a digital circuit element, the bipolar transistor 6 serving as an analog circuit element and the thin-film resistor element 7 serving as a circuit adjusting element.

The signal processing circuit 80 has a first terminal P1 connected to a ground and a second terminal P2 connected to a power source having a predetermined electrical potential (e.g., 5 V). The photo diode 4 has a cathode serially connected to one end of a resistor R1. The other end of the resistor R1 is connected to the above-described power source. An anode of the photo diode 4 is connected to a signal input terminal P3 of the signal processing circuit 80. The thin-film resistor 27 is connected to the signal processing circuit 80. Furthermore, the signal processing circuit 80 comprises a terminal P4 for generating a processed signal as an output of the signal processing circuit 80.

When the photo diode 4 receives incoming light, current I1 flows across the photo diode 4 with a current value corresponding to an intensity of the received light. The current I1 enters in the signal processing circuit 80 through the input terminal P3. The signal processing circuit 80 converts the entered signal into a corresponding voltage. The converted voltage is then amplified and further subjected to a voltage/frequency conversion to generate an output signal from the terminal P4. As described in the first embodiment, the resistance value of the thin-film resistor 27 is adjustable by performing the laser trimming. The adjusted resistance value determines a gain for the signal amplification.

The output terminal P4 of the signal processing circuit 80 is connected to a control apparatus (not shown). For example, this control apparatus receives the output signal (i.e., frequency) of the signal processing circuit 80 and controls the lighting of headlights of an automotive vehicle in accordance with the output frequency (i.e., the intensity of the received light).

According to the embodiment of the present invention, the current I1 of 1 mA flows when the incoming light is 1,000 lux. The signal processing circuit 80 generates a frequency of 500 Hz as a corresponding output.

The circuit operates to avoid any malfunctions that may be caused due to an adverse influence given from extraneous light.

Figure 6:
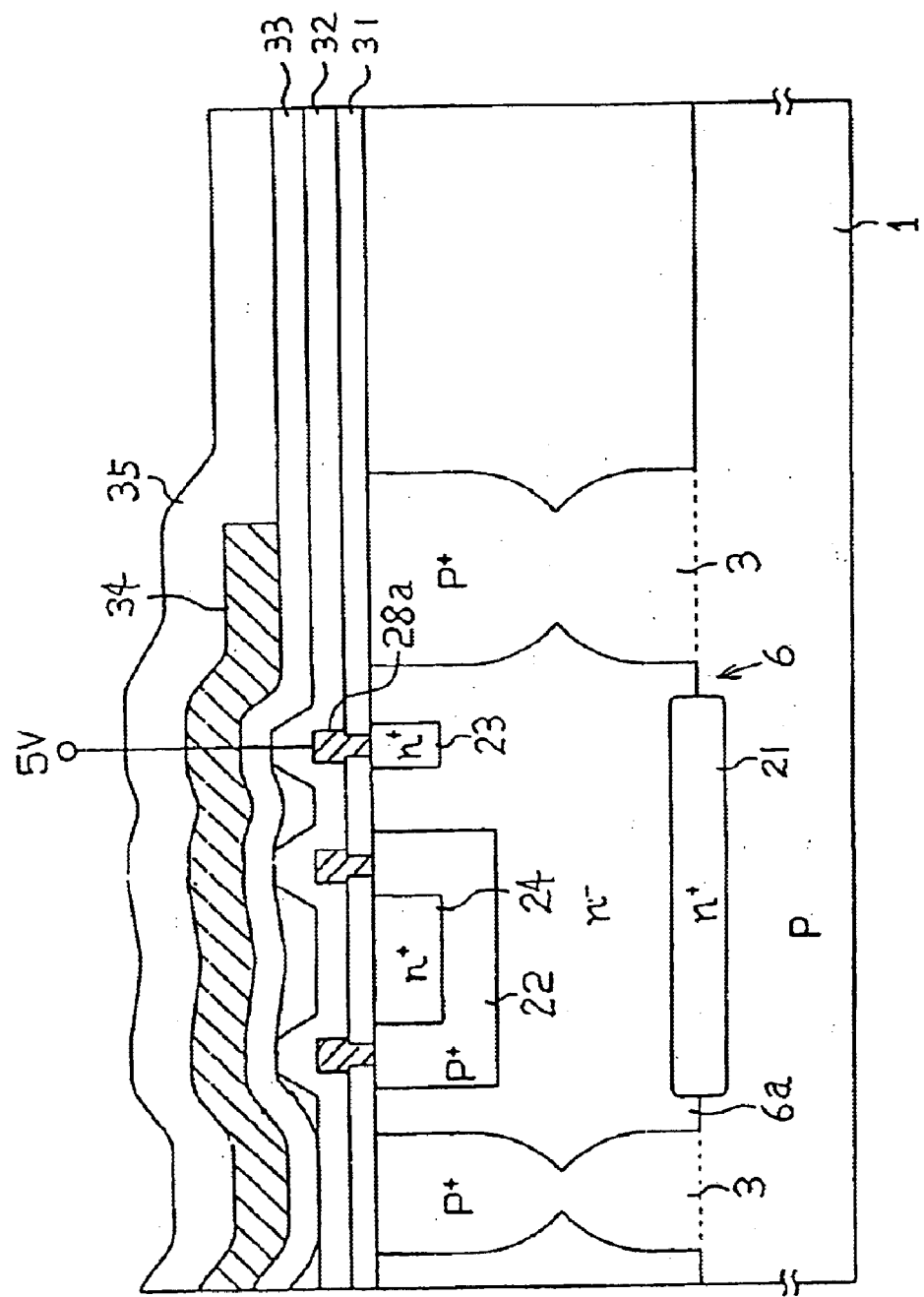
FIG. 6 is an enlarged cross-sectional view showing part of the photo sensing integrated circuit device in accordance with the second embodiment of the present invention.

FIG. 6 is an enlarged view showing the bipolar transistor (i.e., analog circuit element) 6 provided in the element forming region 6a. The element forming region 6a is maintained at 5 volts which is the highest electrical potential in the circuit. More specifically, the element forming region 6a is connected to an electric power terminal of 5V via the region n$^+$ type collector region 23 and the aluminum electrode pattern 28a.

Figure 7:
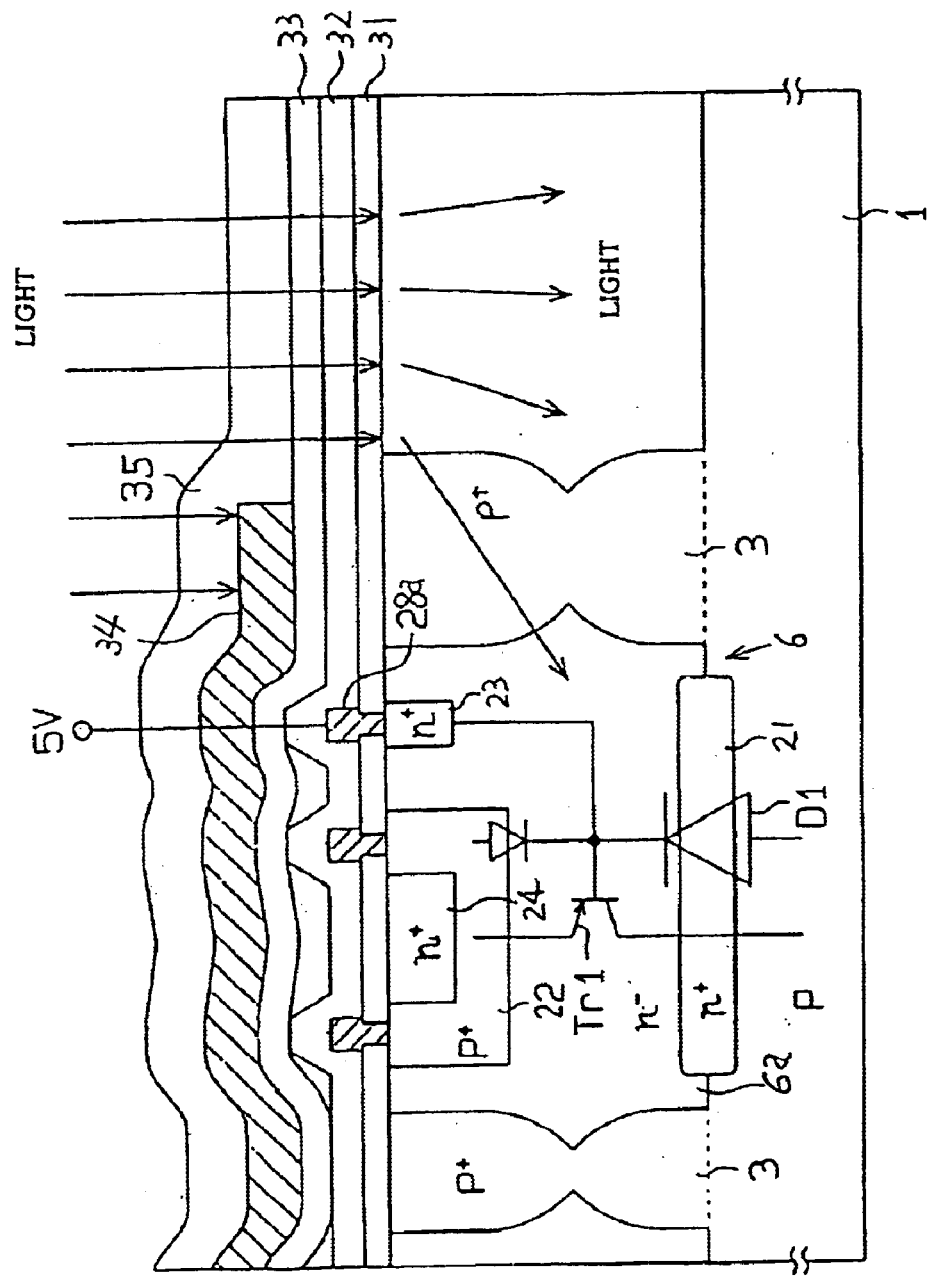
FIG. 7 is an enlarged cross-sectional view illustrating an operation of the photo sensing integrated circuit device in accordance with the second embodiment of the present invention.

As shown in FIG. 7, incoming light enters in the silicon substrate 1. Part of the incident light diffuses to the region covered by the light-shielding film 34. In response to this diffused light, photoelectric current flows across a parasitic diode D1 existing at the p-n junction formed in the periphery of the element forming region 6a. This photoelectric current has a tendency of turning on a parasitic transistor Tr1 existing among the p-type silicon substrate 1, the n$^-$ type element forming region 6a and the p$^+$ region 22. However, according to this embodiment, the element forming region 6a is maintained at the highest electrical potential in the circuit. This means that, in the parasitic transistor Tr1, the base potential is not lower than the emitter potential. This makes it possible to surely maintain the parasitic transistor Tr1 in a turned-off condition. In other words, no short-circuit is caused between the p$^+$ region 22 and the substrate 1. This is effective to prevent malfunctions of the circuit.

Figure 8:
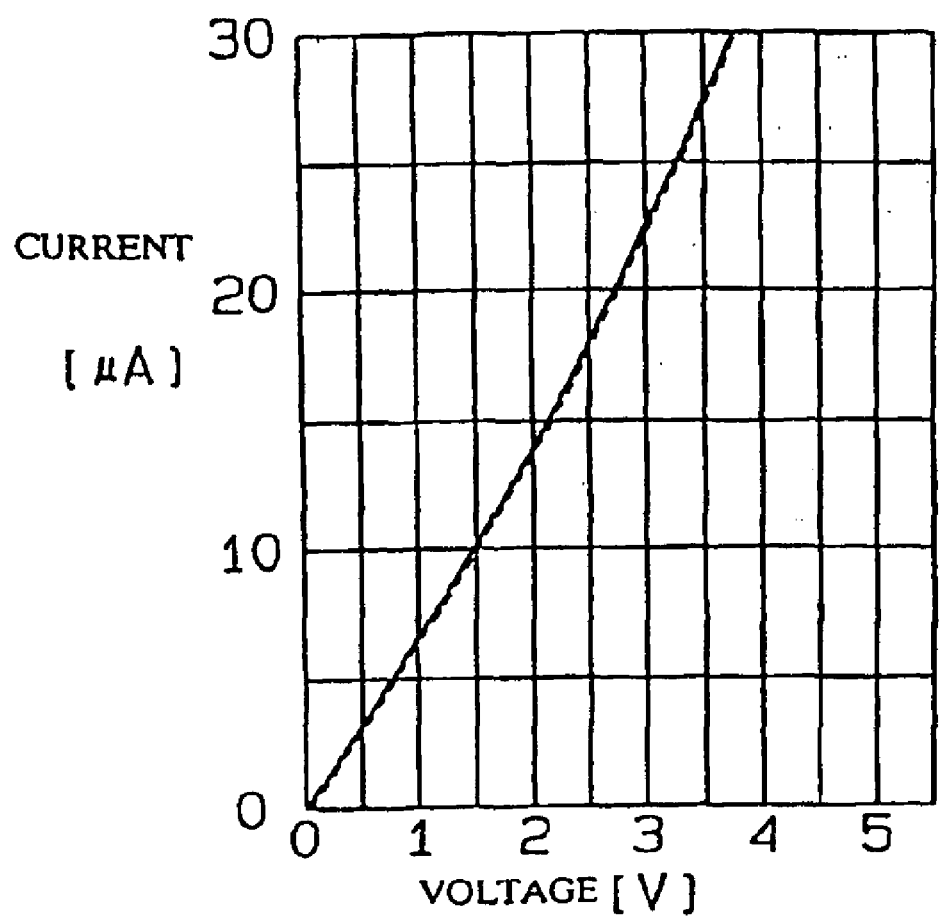
FIG. 8 is a graph showing a current-voltage characteristics of the photo sensing integrated circuit device in accordance with the second embodiment of the present invention.

FIG. 8 shows current-voltage characteristics according to the second embodiment, measured in both conditions of light irradiation and no light irradiation. As apparent from FIG. 8, the current-voltage characteristics was not changed by the light irradiation. This demonstrates that the parasitic PNP transistor did not cause a malfunction due to incoming light. No leak current flows in the circuit.

As described above, according to the second embodiment, an element forming region (6a) is formed on the silicon substrate (1). A circuit element (6) constituting the signal processing circuit (80) is formed in this element forming region. A predetermined voltage is applied to this element forming region. With this arrangement, the parasitic transistor (Tr1) existing in the silicon substrate (1) can maintain a higher base potential. This is effective to prevent the parasitic transistor (Tr1) from erroneously turning on in response to any photoelectric current flowing into the element forming region. It becomes possible to surely prevent the short-circuit in the element forming region, suppress the leak current, and eliminate the malfunction of the circuit due to an adverse influence given by the incoming light.

Third Embodiment

Hereinafter, a third embodiment of the present invention will be explained. The third embodiment discloses an adjusting method and a related apparatus for the photo sensing integrated circuit device disclosed in the above-described first and second embodiments.

Figure 9:
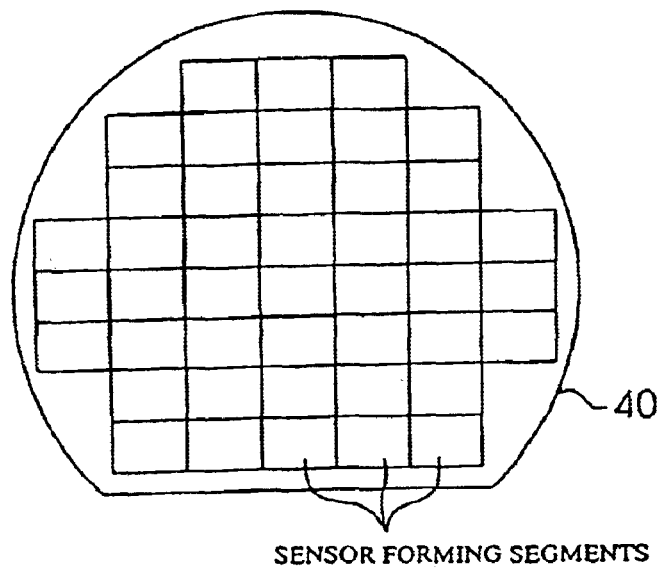
FIG. 9 is a plan view showing a wafer used in accordance with a third embodiment of the present invention.
Figure 11:
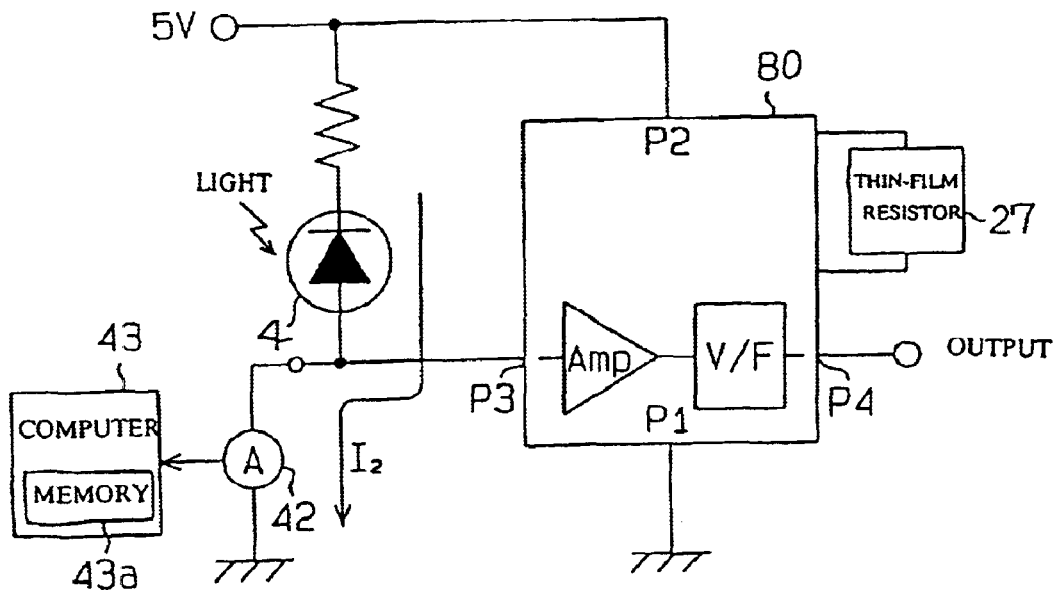
FIG. 11 is a circuit diagram illustrating one step of the circuit adjustment performed in accordance with the third embodiment of the present invention.
Figure 10:
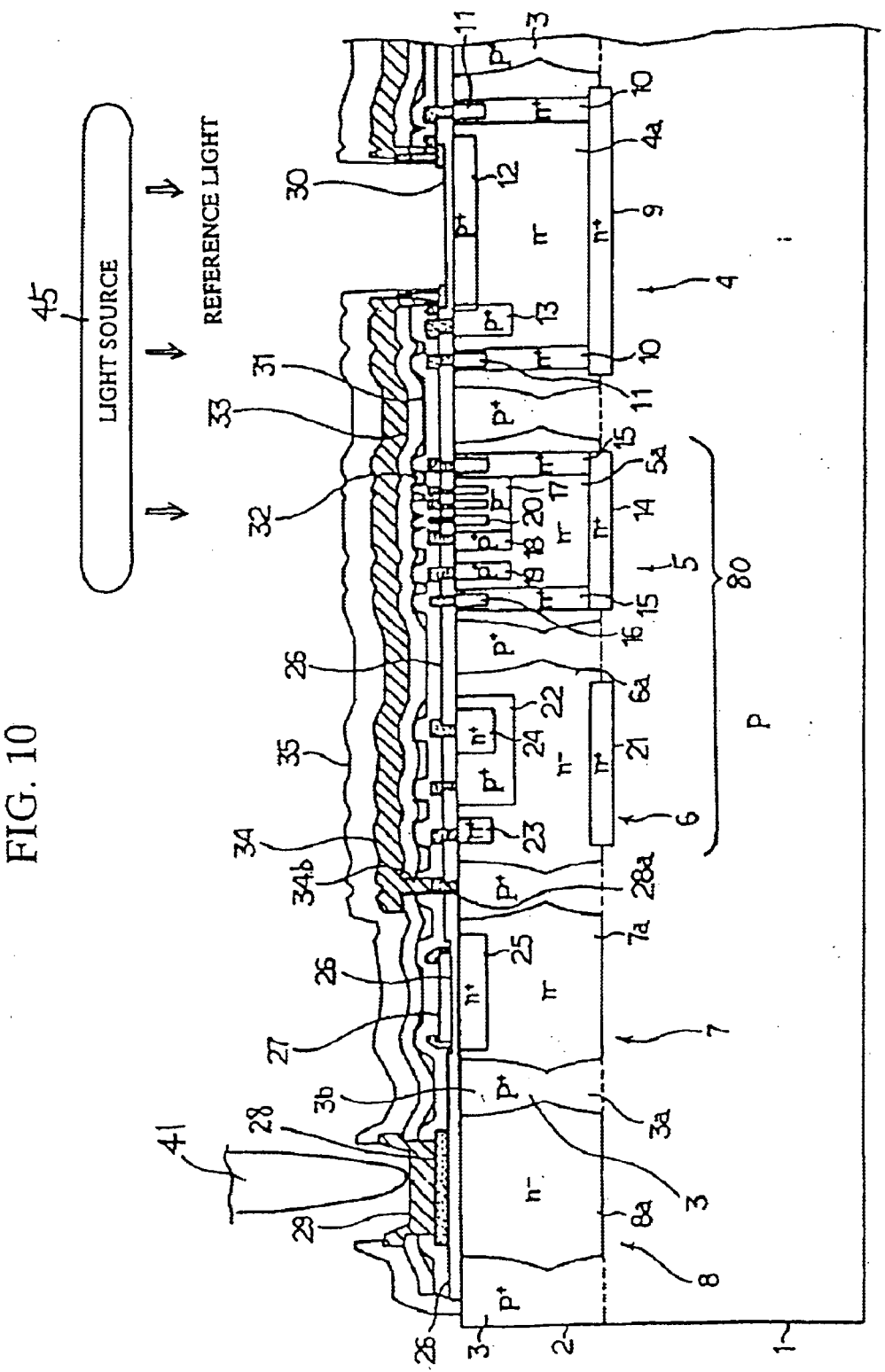
FIG. 10 is a vertical cross-sectional view illustrating a circuit adjustment performed in accordance with the third embodiment of the present invention.

First, as shown in FIG. 9, a wafer 40 is prepared for providing a plurality of sensor forming segments arranged in a matrix pattern. This wafer 40 corresponds to a green state of the thin-film resistor 27 that is not provided with the cutout T. Then, as shown in FIG. 10, a probe 41 is placed on the electrode pattern 29. As shown in FIG. 11, one end of an ammeter 42 is connected to the anode of the photo diode 4. The other end of the ammeter 42 is grounded. This ammeter 42 is connected to a computer 43 which includes a memory 43*a*.

Then, reference light is emitted from a light source 45 as shown in FIG. 10. The photo diode 4 is subjected to the irradiation of this reference light having 1,000 lux intensity. The ammeter 42 measures a current value I2 flowing across the photo diode 4. The computer 43 stores (records) the measured current value I2 in connection with a chip position in the wafer 40.

Figure 12:
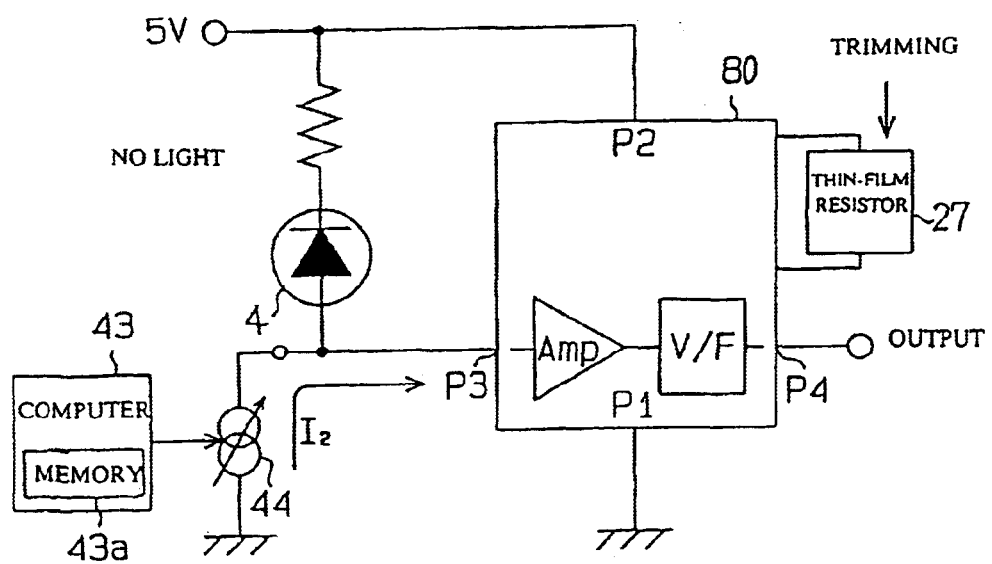
FIG. 12 is a circuit diagram illustrating another step of the circuit adjustment performed in accordance with the third embodiment of the present invention.
Figure 13:
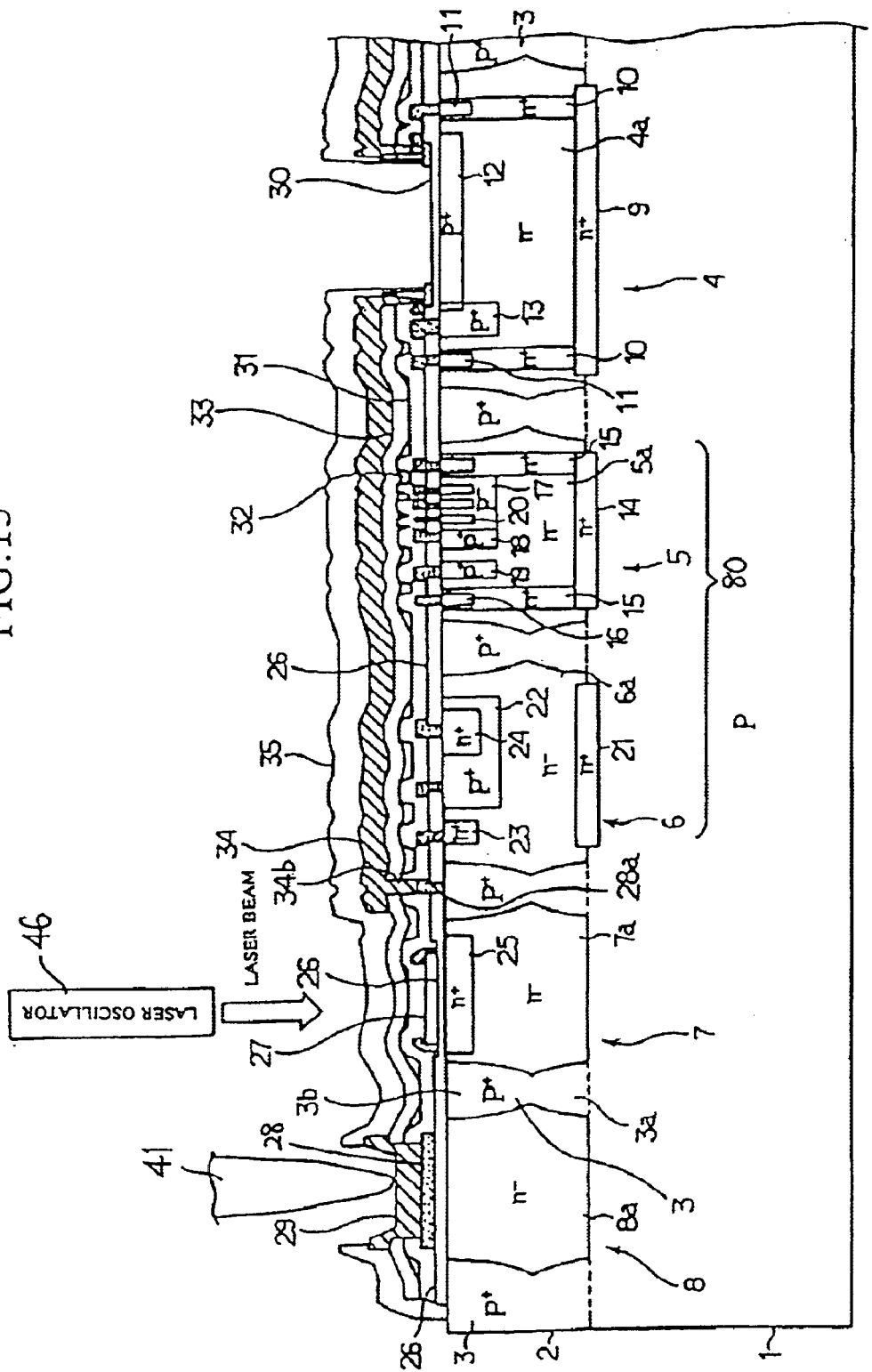
FIG. 13 is a vertical cross-sectional view illustrating the circuit adjustment performed in accordance with the third embodiment of the present invention.

Next, the ammeter 42 is replaced by a variable constant-current circuit (i.e., a current generating source) 44 as shown in FIG. 12. The variable constant-current circuit 44 supplies current to the signal processing circuit 80 by the same amount as the measured current value I2. No light is irradiated on the photo diode 4 in this condition. Then, as shown in FIG. 13, a laser beam is emitted from a laser oscillator 46 and irradiated on the thin-film resistor 27 to perform the laser trimming. Namely, the cutout T shown in FIG. 1 is formed on the thin-film resistor 27 for generating a desired output (500 Hz) from the signal processing circuit 80. The used laser may be a YAG laser or a YLF laser (having a wavelength of approximately 1.06 $\mu$m).

The similar output adjustment is performed on other sensor forming segments of the wafer 40. After finishing the output adjustment, the wafer 40 is cut into separate sensor chips.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An adjusting method for a single chip photo sensing device comprising a photoelectric transfer element for converting received light into an electric signal, a signal processing circuit for processing said electric signal of said photoelectric transfer element, and a thin-film resistor used for a circuit adjustment, said adjusting method comprising the steps of:

connecting an ammeter to an output terminal of said photoelectric transfer element;

irradiating reference light having a predetermined intensity on said photoelectric transfer element;

storing a current value detected by said ammeter when said photoelectric transfer element is irradiated by said reference light;

replacing said ammeter with a current generating source;

supplying current from said current generating source to said signal processing circuit by an amount identical with said stored current value under a condition no light is irradiated on said photoelectric transfer element; and performing a laser trimming on said thin-film resistor to generate a desired output from said signal processing circuit as a result of the circuit adjustment.

2. The adjusting method in accordance with claim 1, wherein said photoelectric transfer element is a photo diode and said output terminal is an anode.

3. The adjusting method in accordance with claim 1, wherein said circuit adjustment is performed on a wafer comprising a plurality of sensor forming segments.

4. An adjusting apparatus for a single chip photo sensing device comprising a photoelectric transfer element for converting received light into an electric signal, a signal processing circuit for processing said electric signal of said photoelectric transfer element, and a thin-film resistor used for a circuit adjustment, said adjusting apparatus comprising:

an ammeter connected to an output terminal of said photoelectric transfer element;

a light source for irradiating reference light having a predetermined intensity on said photoelectric transfer element;

a memory means for storing a current value detected by said ammeter when said photoelectric transfer element is irradiated by said reference light emitted from said light source;

a current generating source replaceable with said ammeter for supplying current to said signal processing circuit by an amount identical with said current value stored in said memory means; and a laser oscillator for performing a laser trimming on said thin-film resistor to generate a desired output from said signal processing circuit in response to said current entered from current generating source as a result of the circuit adjustment, said laser trimming being performed under a condition no light is irradiated on said photoelectric transfer element.

5. The adjusting apparatus in accordance with claim 4, wherein said photoelectric transfer element is a photo diode and said output terminal is an anode.

6. The adjusting apparatus in accordance with claim 4, wherein said circuit adjustment is performed on a wafer comprising a plurality of sensor forming segments.

7. An adjusting method for a photo sensing integrated circuit device comprising a light-receiving element having a light-receiving portion formed on a chip surface thereof, a signal processing circuit comprising a digital circuit element, an analog circuit element and a circuit adjusting element cooperatively processing a detection signal produced from said light-receiving element, and a light-shielding film provided for selectively setting a light-receiving region on said chip surface, said adjusting method comprising the steps of:

connecting an ammeter to an output terminal of said light-receiving element;

irradiating reference light having a predetermined intensity on said light-receiving portion of said light-receiving element;

storing a current value detected by said ammeter when said light-receiving portion is irradiated by said reference light;

replacing said ammeter with a current generating source;

supplying current from said current generating source to said signal processing circuit by an amount identical with said stored current value under a condition no light is irradiated on said light-receiving portion of said light-receiving element; and performing a laser trimming on said circuit adjusting element to generate a desired output from said signal processing circuit.

8. The adjusting method in accordance with claim 7, wherein said light-receiving element is a photo diode and said output terminal is an anode.

9. The adjusting method in accordance with claim 7, wherein said adjustment is performed on a wafer comprising a plurality of sensor forming segments.

10. An adjusting apparatus for a photo sensing integrated circuit device comprising a light-receiving element having a light-receiving portion formed on a chip surface thereof, a signal processing circuit comprising a digital circuit element, an analog circuit element and a circuit adjusting element cooperatively processing a detection signal produced from said light-receiving element, and a light-shielding film provided for selectively setting a light-receiving region on said chip surface, said adjusting apparatus comprising:

an ammeter connected to an output terminal of said light-receiving element;

a light source for irradiating reference light having a predetermined intensity on said light-receiving portion of said light-receiving element;

a memory means for storing a current value detected by said ammeter when said light-receiving portion is irradiated by said reference light emitted from said light source;

a current generating source replaceable with said ammeter for supplying current to said signal processing circuit by an amount identical with said current value stored in said memory means; and a laser oscillator for performing a laser trimming on said circuit adjusting element to generate a desired output from said signal processing circuit in response to said current entered from current generating source, said laser trimming being performed under a condition no light is irradiated on said light-receiving portion of said light-receiving element.

11. The adjusting apparatus in accordance with claim 10, wherein said light-receiving element is a photo diode and said output terminal is an anode.

12. The adjusting apparatus in accordance with claim 10, wherein said adjustment is performed on a wafer comprising a plurality of sensor forming segments.

* * * * *